United States Patent [19]

Bush et al.

[11] Patent Number: 4,773,687
[45] Date of Patent: Sep. 27, 1988

[54] WAFER HANDLER

[75] Inventors: Donald R. Bush, North Whitehall Township, Lehigh County; Gary J. Reichl, Lower Milford Township, Lehigh County, both of Pa.

[73] Assignee: American Telephone and Telegraph Company, AT&T Technologies, Inc., Berkeley Heights, N.J.

[21] Appl. No.: 53,980

[22] Filed: May 22, 1987

[51] Int. Cl.$^4$ ............................................ B25J 15/06
[52] U.S. Cl. .................................. 294/64.1; 294/64.3
[58] Field of Search ................... 294/64.1, 64.2, 64.3, 294/65; 414/752, 676, 744 B, 627

[56] References Cited

U.S. PATENT DOCUMENTS

| | | | |
|---|---|---|---|
| 3,431,009 | 3/1969 | Mammel | 294/64.3 |
| 3,523,706 | 8/1970 | Logue | 294/64.3 |
| 4,002,254 | 1/1977 | Olofsen | 294/64.3 |
| 4,029,351 | 6/1977 | Apgar et al. | 294/64.3 |
| 4,118,058 | 10/1978 | Rahn et al. | 294/64.3 |
| 4,445,494 | 5/1984 | Schiele et al. | 294/64.3 |
| 4,566,726 | 1/1986 | Correnti et al. | 294/64.3 |

FOREIGN PATENT DOCUMENTS 0201240  11/1986  European Pat. Off. ............ 294/64.3

OTHER PUBLICATIONS

IBM Technical Disclosure Bulletin, vol. 22, No. 8A, Jan. 1980, pp. 3370–3371.
IBM Technical Disclosure Bulletin, vol. 22, No. 5, Oct. 1979, "Diverted Flow Bernoulli Pick-Up Device", W. Balder & R. Cachon.
IBM Technical Disclosure Bulletin, vol. 16, No. 10, Mar. 1974, "Wafer Handler Assembly", A. G. Vokali.

*Primary Examiner*—James B. Marbert
*Attorney, Agent, or Firm*—James H. Fox

[57] ABSTRACT

A wafer handling technique allows for picking up a wafer from its front side. One or more vacuum ports pull the periphery of the wafer into contact with a ledge raised from a broad surface, providing a friction force that prevents lateral movement of the wafer. A port in the broad surface of the handler flows pressurized gas onto the wafer, thereby preventing contact between the handler and the interior of the wafer. The handler may be sized to be relatively thin, and to cover less than half of the surface of the wafer, thereby allowing for readily loading wafers back-to-back in a furnace boat.

12 Claims, 2 Drawing Sheets

WAFER HANDLER

BACKGROUND OF THE INVENTION

1. Field of the Invention

The present invention relates to a technique for handling wafers, including, for example, semiconductor wafers.

2. Description of the Prior Art

The handling of semiconductor wafers has been accomplished by a variety of techniques. For picking up a wafer, a vacuum-assisted handler has been used, wherein the wafer is pulled against a vacuum outlet. However, this results in the wafer being contacted by the handler, which can result in damage to the wafer. Hence, vacuum handlers are typically used only for picking up the wafer by its back side, which is the side opposite that on which the integrated circuits (or other devices) are formed. For picking up a wafer from the front side, it is known to use the Bernoulli effect, wherein a pressurized fluid is directed onto a surface of the wafer, creating a lateral flow across the surface. This produces a low pressure area that holds the wafer near the handler. However, the wafer is still free to move laterally, which may be prevented by the use of projections on the handler that surround the wafer. It is also known to use the Bernoulli effect to pick up a wafer, and then apply a vacuum while interrupting the Bernoulli air flow, in order to hold the wafer against the handler; see, for example, U.S. Pat. No. 4,566,726.

However, there are applications for a wafer handler that can not only pick up a wafer from its front side, but also load two wafers back-to-back in a boat for introduction into a furnace, or other processing apparatus. In that case, the wafer handler should be thin enough to fit into a boat having wafers in adjacent slots while not contacting those wafers. To facilitate loading and unloading boats or cassettes having bottoms and sides, it is also desirable that the handler cover less than half of the wafer. It is further desirable to be able to pick up a semiconductor wafer regardless of the location of the major or minor "flats", which are straight portions along the otherwise circular periphery of the wafer.

SUMMARY OF THE INVENTION

I have invented a technique for handling a wafer, wherein a pressurized fluid is flowed through an opening in a broad surface of a handler and against an interior portion of a surface of the wafer, while a vacuum is simultaneously applied near the edge of the wafer. The vacuum is sufficient to hold a peripheral portion of the wafer surface against a ledge that is raised with respect to the broad surface of the handler. The pressurized fluid prevents the interior portion of the wafer surface from contacting the broad surface of the wafer handler. The handler may be sized so as to cover less than half of the wafer, and in a preferred embodiment covers less than one-quarter of the wafer.

DETAILED DESCRIPTION

Figure 1:
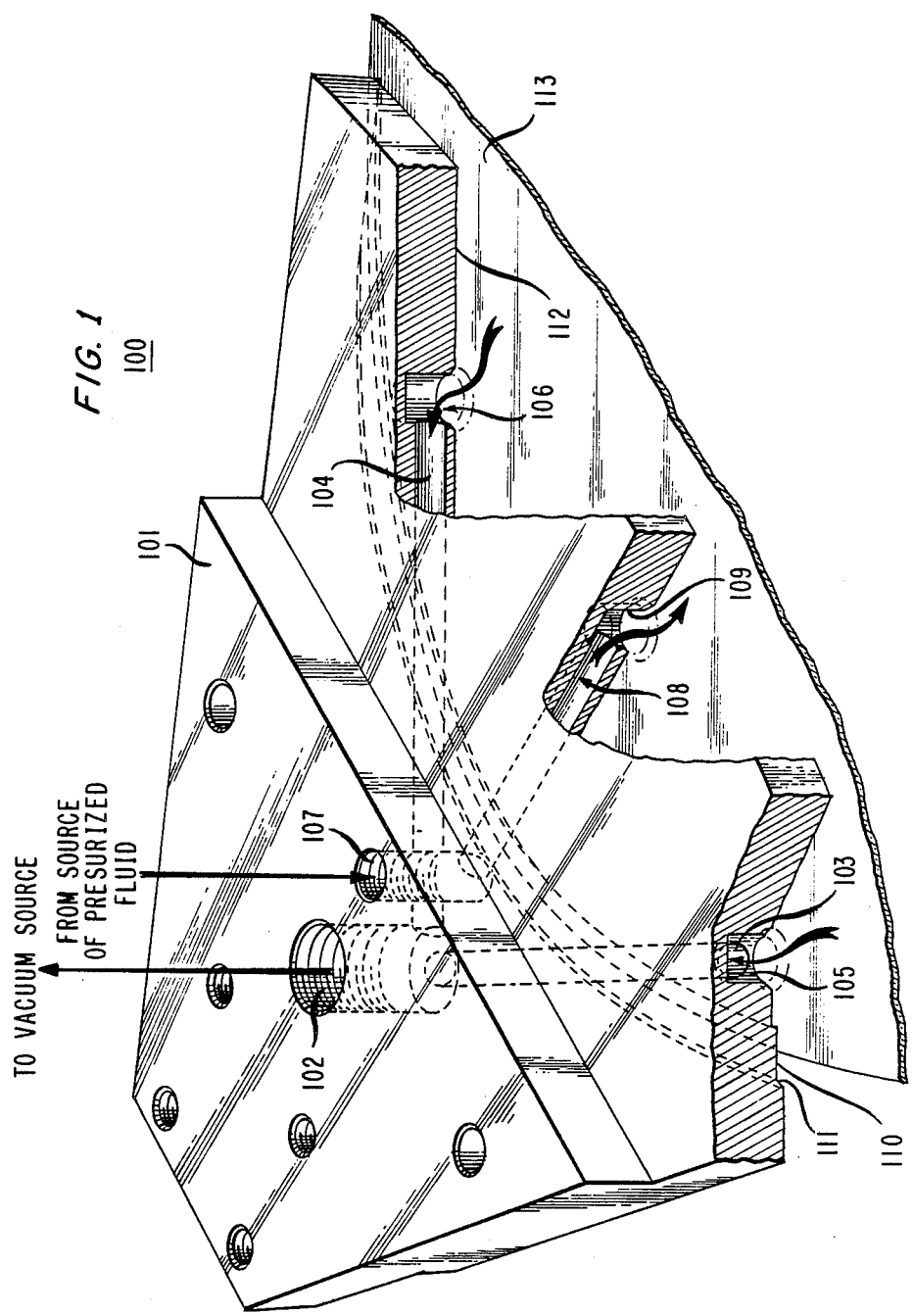
FIG. 1 illustrates an isometric sectional view of a handler suitable for implementing the present technique, showing a wafer positioned on the ledge of the handler.
Figure 2:
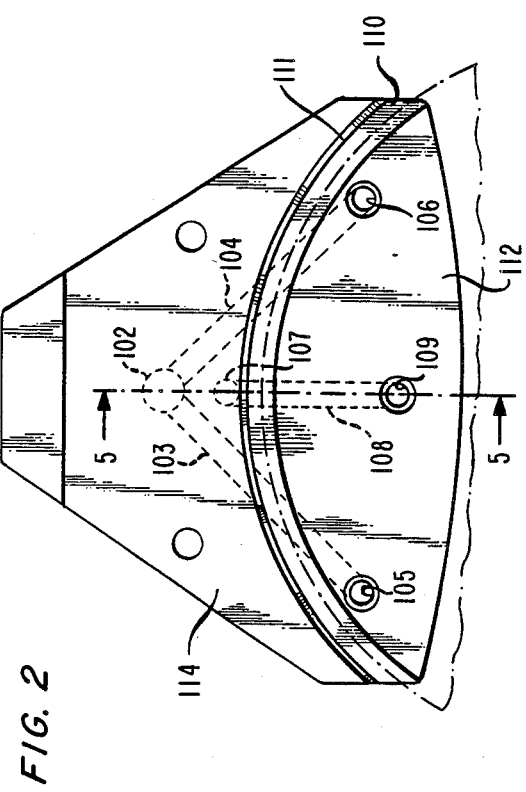
FIG. 2 illustrates a bottom view of the handler.

The following detailed description relates to an improved technique for handling wafers. Referring to FIG. 1 a wafer handler 100 includes a mounting surface 101 for attachment to a robot arm, or to a handle if manual operation is desired. A broad surface 112 of the handler is shown covering a portion of a wafer 113. The broad surface includes vacuum ports 105 and 106 for providing a vacuum that holds a peripheral portion of the wafer in contact with a ledge 110 that is raised from the broad surface of the handler. A pressure port 109 is located in the interior of the broad surface (i.e, further away from the ledge as compared to the vacuum ports). The pressure port 109 provides a flow of pressurized fluid, typically high purity nitrogen gas, that impinges on the surface of the wafer. This flow pushes against the surface of the wafer, thereby preventing the interior portion of wafer 113 from contacting the broad surface 112. The pressure port 109 communicates through passage 108 with opening 107, which in operation is connected to an external source of pressurized fluid. Similarly, the vacuum ports 105, 106 communicates through passages 103, 104 respectively with opening 102 that in operation is connected to a source of vacuum. FIG. 2 shows the handler of FIG. 1 as viewed from the bottom. The inner surface 114 is shown, with a wafer covering the broad surface 112.

Figure 3:
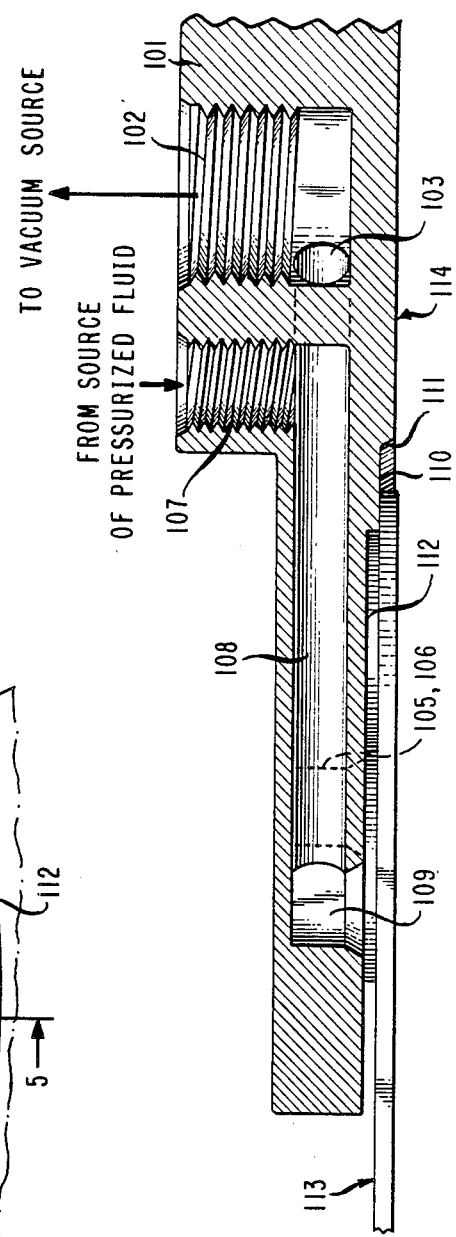
FIG. 3 illustrates a sectional view of the handler.

Referring to FIG. 3, a sectional view of the handler taken along line 5—5 of FIG. 2, is shown with an accompanying wafer. The numbers correspond to the identical regions shown in FIG. 1. Note that the ledge 110 is raised from the broad surface 112. A beveled region 111 is optionally included to provide a smooth transition between the ledge 110 and the surface 114, to reduce the chance of damaging the wafer if it is misaligned with the handler in operation. The periphery of wafer 113 is shown pulled against ledge 110 by the vacuum from ports 105, 106. The contact between the wafer and the ledge provides a friction force that prevents lateral movement of the wafer with respect to the handler, when in either the horizontal or vertical position. Furthermore, the interior portion of the wafer is pushed away from the broad surface (112) by the fluid flow out of pressure port 109. Hence, the wafer surface 113 located nearest the broad surface of the handler may be the front side, on which the active portions of integrated circuits are formed, without being subjected to damage from the handler. In a typical embodiment, the ledge 110 is raised 8 mils (0.2 millimeters) from the broad surface 112, and the width of the ledge is about 180 mils (4.6 millimeters). A typical silicon wafer having integrated circuits formed thereon has an inactive peripheral strip about 100 mils (2.5 millimeters) wide. When handling a wafer, the ledge contacts only about 70 mils (1.8 millimeters) of this peripheral strip, thereby avoiding contact with the active area of the front surface 113. The thickness of a typical silicon wafer is about 25 mils (0.6 millimeters). Therefore, by making the height of surface 114 less than this amount (as measured from the ledge 110), the handler may be used to pick up a wafer from a flat surface if desired. In addition, the relatively small thickness of the handler in the region covering the wafer makes it possible to insert and remove wafers from boats and cassettes having a multiplicity of wafers in adjacent slots. While the arrangement of the features shown above is satisfactory for practicing the present invention, still other arrangements are possible, including the use of a different number of ports, using elongated ports (i.e., slots) instead of circular ports, and increasing or decreasing the size of the handler.

A typical sequence of operations of the wafer handler is as follows, with the values given being suitable for use with a silicon wafer 5 inches (125 millimeters) in diameter, and having a thickness of 25 mils (0.6 millimeters). A flow of pressurized gas is directed through port 109 (ultra pure nitrogen at a pressure of about 22 psi (1.5 kilograms per square meter) is suitable for a port (109) having a diameter of 3/16 inch (4.8 millimeters)). The handler is positioned adjacent to a wafer, with the broad surface 112 being about 50 mils (1.2 millimeters) away from the surface 113 of the wafer, and the ledge 110 being aligned with the periphery of the wafer. Then, a vacuum is applied through vacuum ports 105, 106, which pulls the wafer into contact with the ledge 110. A vacuum of 20 inches of Hg (67 kN/m$^2$) is suitable for use with vacuum ports 3/16 inch (4.8 millimeters) in diameter for providing enough friction against the ledge to prevent the wafer from falling out of the handler when suspended vertically. The wafer may be picked up from either a horizontal or vertical orientation, or any intermediate orientation. After being moved by the handler to a desired location, the vacuum is removed from ports 105, 106, while maintaining the fluid flow at least momentarily from port 109. This allows the wafer to be released from the handler, while still preventing contact between the wafer and the broad surface 112. The handler is removed from the vicinity of the wafer, and the fluid flow from port 109 is terminated if desired.

The handler may be made of aluminum, having a nickel coating for hardness. Two handlers as described above may be used to load two wafers back to back. In that case, the wafers may be picked up horizontally by two handlers having a common pivot located at the top of the mounting surface 101. The handlers are then pivoted into a vertical configuration, so that the back sides of the wafers are adjacent. The wafers may then be loaded into a furnace boat having slots for a multiplicity of wafer pairs. The unloading operation may then be accomplished in a reverse sequence by means of the present technique. Although the foregoing has shown the inventive technique with semiconductor wafers, it is applicable to handling other items, including magnetic discs, optical discs, etc., which are considered to be "wafers" herein. Still other applications of the present technique will become apparent to persons of skill in the art, and are included herein.

What is claimed is:

1. A method for handling a wafer by means of a handler having at least one vacuum port and at least one port for flowing a pressurized fluid, characterized by applying a vacuum through a vacuum port located in a broad surface of the handler near a ledge raised with respect to said broad surface, thereby pulling a portion of the periphery of the wafer into contact with said ledge, and flowing a pressurized fluid through a pressure port located in said broad surface at a distance from said ledge greater than said vacuum port so as to push said wafer away from contact with said broad surface.

2. The method of claim 1 wherein said vacuum is applied through at least two vacuum ports located near said ledge.

3. The method of claim 1 wherein the broad surface of said handler has an area that is less than one half the area of a surface of said wafer.

4. The method of claim 1 wherein the broad surface of said handler has an area that is less than one-quarter the area of a surface of said wafer.

5. The method of claim 1 wherein said ledge is in the form of an arc located at a periphery of said broad surface.

6. The method of claim 1 wherein said flowing is commenced when said handler and said wafer are positioned in the vicinity of one another, and said vacuum is thereafter applied, in order to pick up said wafer.

7. The method of claim 1 wherein said vacuum is terminated while said fluid is being flowed, in order to release said wafer.

8. The method of claim 1 wherein said wafer is a semiconductor wafer.

9. The method of claim 1 wherein said portion of the periphery of the wafer is less than half the periphery.

10. An apparatus for handling a wafer, with said apparatus comprising at least one pressure port through which a pressurized fluid is flowed, and at least one port through which a vacuum is applied, characterized in that said apparatus comprises a broad surface having an area less than half the area of a surface of said wafer, wherein said broad surface includes at least one vacuum port located near a ledge raised with respect to said broad surface and adapted to pulling a portion of the periphery of the wafer into contact with said ledge, and further comprises at least one pressure port for flowing a fluid against an interior portion of said wafer.

11. The apparatus of claim 10 wherein the broad surface of said apparatus has an area less than one-quarter the area of a surface of said wafer.

12. The apparatus of claim 10 wherein said portion of the periphery of the wafer is less than half the periphery.

* * * * *